United States Patent [19]
Suzuki

[11] Patent Number: 5,990,742
[45] Date of Patent: Nov. 23, 1999

[54] DIFFERENTIAL AMPLIFIER CIRCUIT

[75] Inventor: Hisao Suzuki, Kasugai, Japan

[73] Assignee: Fujitsu Limited, Kanagawa, Japan

[21] Appl. No.: 09/076,919

[22] Filed: May 13, 1998

[30] Foreign Application Priority Data

Nov. 26, 1997 [JP] Japan .................................. 9-324515

[51] Int. Cl.[6] .................................................. H03F 3/45
[52] U.S. Cl. ........................ 330/253; 330/255; 330/257
[58] Field of Search ................................... 330/255, 253, 330/257, 260

[56] References Cited

U.S. PATENT DOCUMENTS

| | | | |
|---|---|---|---|
| 4,241,313 | 12/1980 | Takehara | 330/253 |
| 4,935,703 | 6/1990 | Poletto | 330/255 |
| 5,475,343 | 12/1995 | Bee | 330/255 |
| 5,497,124 | 3/1996 | Yamashita et al. | 330/255 |
| 5,515,006 | 5/1996 | Chan | 330/255 |

Primary Examiner—Robert Pascal
Assistant Examiner—Khanh Van Nguyen
Attorney, Agent, or Firm—Nikaido Marmelstein Murray & Oram LLP

[57] ABSTRACT

A differential amplifier circuit includes a differential input circuit which receives first and second input signals. The differential input circuit amplifies a potential difference between the input signals and outputs first and second voltage signals at first and second output terminals representing the amplified potential difference. A first output transistor is connected between a high potential power supply and a third output terminal of the differential input circuit. The first output transistor pulls up the potential at the third output terminal. A second output transistor is connected between the third output terminal and a low potential power supply for pulling down the potential at the third output terminal. A gate voltage controller is connected to the first and second output terminals and receives the first and second voltage signals and controls voltages applied to each of the gate terminals of the first and second output transistors to control the currents flowing to them.

22 Claims, 7 Drawing Sheets

DIFFERENTIAL AMPLIFIER CIRCUIT

FIELD OF THE INVENTION

The present invention relates to a differential amplifier circuit for use in a semiconductor integrated circuit, and more particularly, to a differential amplifier circuit used in a comparator circuit and an operational amplifier (hereafter abbreviated as "op amp") circuit.

BACKGROUND OF THE INVENTION

Referring to FIG. 1, a conventional comparator circuit 10 formed by MOS transistors is shown. In the comparator circuit 10 shown, when an input signal Vin1 is at a higher level than an input signal Vin2, a drain current passing through a transistor Tr3 decreases to reduce the potential at a node N1 (or a gate of a transistor Tr7) substantially to the ground GND level. As a consequence, the transistor Tr7 is turned off, delivering an output signal Vout of an H level at an output terminal To.

On the other hand, when the input signal Vin1 is at a lower level than the input signal Vin2, the drain current passing through the transistor Tr3 increases to raise the potential at the node N1 (or the gate of the transistor Tr7). Consequently, the transistor Tr7 is turned on, passing the drain current of the transistor Tr7 through a resistor R and delivering the output signal Vout of an L level, which is substantially equal to the ground GND level, to the output terminal To.

In this manner, the comparator circuit 10 operates to deliver an output of either H level or L level in accordance with a result of comparison between the both signals Vin1, Vin2.

An op amp circuit is formed by feeding back the output signal Vout as the input signal Vin2. In this instance, the op amp circuit operates to bring the voltage levels of both signals Vin1, Vin2 substantially into coincidence with each other.

More specifically, P-channel MOS transistors Tr1 and Tr2 each have a source connected to a power supply Vcc (high potential bus) and a gate connected to the drain of the transistor Tr1. The gates of both of the transistors Tr1 and Tr2 are connected together. A current source 1 is connected to the drain of the transistor Tr1. The transistors Tr1 and Tr2 form a current mirror circuit. The transistor Tr2 operates as a constant current source, which passes a drain current equal to the current flow through the current source 1.

The drain of the transistor Tr2 is connected to sources of each of the P-channel MOS transistors Tr3 and Tr4. The transistor Tr3 has a drain connected to the drain of an N-channel MOS transistor Tr5. A source of the transistor Tr5 is connected to the ground GND (or low potential bus). A junction between the transistor Tr3 and the transistor Tr5 defines the node N1.

The transistor Tr4 has a drain connected to the drain of an N-channel MOS transistor Tr6 and to the gates of the transistors Tr5 and Tr6. The transistor Tr6 has a source connected to the ground GND. The gates of both of the transistors Tr5 and Tr6 are connected together.

The input signals Vin1, Vin2 are input to the gates of the transistors Tr3 and Tr4, respectively. The transistors Tr3 to Tr6 form a differential input circuit which is activated by the constant current supplied from the transistor Tr2.

An N-channel MOS transistor Tr7 has a gate connected to the node N1, a drain connected to the power supply Vcc through a resistor R, and a source connected to the ground GND. An output terminal To which delivers the output signal Vout is connected to the drain of the transistor Tr7.

Referring now to FIG. 2, a second conventional comparator circuit 20 is shown. In the comparator circuit 20, the resistor R of the comparator circuit 10 is replaced by a P-channel MOS transistor Tr8 having a gate connected to the gates of the transistors Tr1 and Tr2.

The transistor Tr8 operates as a constant current source which supplies an idling current to the output terminal To. The idling current from the transistor Tr8 is chosen to be sufficiently small as compared with a maximum drain current from the transistor Tr7.

In the comparator circuit 20, when the drain current from the transistor Tr7 is greater than the idling current from the transistor Tr8, as attributable to a rise in the potential at the node N1, the output signal Vout is established at its L level.

On the other hand, when the drain current from the transistor Tr7 is less than the idling current from the transistor Tr8, as attributable to a reduction in the potential at the node N1, the output signal Vout is established at its H level.

The comparator circuit 20 may also be operated as an op amp circuit by feeding the output signal Vout back as the input signal Vin2.

Referring to FIG. 3, a third conventional comparator circuit 30 is shown. In the comparator circuit 30 shown, the resistor R of the comparator circuit 10 is replaced by a P-channel MOS transistor Tr9, the gate potential of which is controlled by P-channel MOS transistors Tr10 and Tr11. The transistors Tr7 and Tr9 are chosen such that they exhibit substantially equal load driving capabilities.

The transistor Tr10 has a source connected to the power supply Vcc, a gate connected to the gates of the transistors Tr1 and Tr2 and a drain connected to the gate of the transistor Tr9 and to the source of the transistor Tr11. A constant drain current passes through the transistor Tr10. The transistor Tr11 has a gate connected to the node N1 and a drain connected to the ground GND. A drain current from the transistor Tr10 is chosen to be sufficiently smaller than a maximum drain current of the transistor Tr11.

In the comparator circuit 30, when the transistor Tr7 is turned on as attributable to a rise in the potential at the node N1, the source potential of the transistor Tr11 or the gate potential of the transistor Tr9 rises, causing the transistor Tr9 to be turned off, establishing the output signal Vout at its L level.

On the other hand, when the transistor Tr7 is turned off due to a fall in the potential at the node N1, the source potential of the transistor Tr11 or the gate potential of the transistor Tr9 is reduced, causing the transistor Tr9 to be turned on, establishing the output signal Vout at its H level. In this manner, the transistors Tr7 and Tr9 operate in a push-pull mode in accordance with a change in the potential at the node N1.

The comparator circuit 10 in FIG. 1 (according to the first prior art) has a difficulty obtaining a maximum utilization of the current driving capability of the transistor Tr7. Referring to FIG. 1 again, when the transistor Tr7 is turned off, the source (or discharge) current Iso delivered to a load from the output terminal To is given as follows:

$$Iso = (Vcc - Vout)/R$$

and the source current varies with a change in the output signal Vout.

The source current Iso is reduced when the resistor R has a relatively high resistance. When a load connected to the output terminal To is excessive, a rise of the output signal Vout from its L to its H level may be retarded.

By contrast, the source current Iso may be increased by reducing the resistance of the resistor R. However, when a sink current Isi is drawn into the transistor Tr7 from the output terminal To as the transistor Tr7 is turned on, the source current Iso may retard the flow of the sink current Isi, thus retarding the falling edge of the output signal Vout. Since the current flow from the power supply Vcc through the resistor R and transistor Tr7 to the ground GND increases, the current dissipation of the comparator circuit 10 increases.

The drain current of an MOS transistor generally increases as the potential difference between the gate potential Vg and the source potential Vs increases. Denoting the gate-source voltage of the transistor Tr3 by Vgs (Tr3) and its source-drain voltage by Vds (Tr3), the potential at the node N1 or the gate potential Vg (Tr7) of the transistor Tr7 is given as follows:

$$Vg(Tr7)=Vin1+Vgs(Tr3)-Vds(Tr3)$$

When the level of the input signal Vin1 falls, the potential at the node N1 rises. However, the potential at the node N1 cannot rise close to the level of the power supply Vcc as a result of a suppressing effect of the input signal Vin1. This means that it is difficult to achieve a gate potential for the transistor Tr7 which allows its full movement from the supply voltage Vcc to the ground GND level. Similarly, a gate potential for the transistor Tr7 which allows its full movement also cannot be obtained in the second and the third prior circuits 20, 30. Accordingly, the current driving capability of the transistor Tr7 cannot be used to its full extent when the output signal Vout of the L level is delivered, such that the falling rate of the output signal Vout cannot be fully accelerated.

By contrast, in the second circuit 20, it is possible to establish a constant source current Iso which is supplied from the output terminal To to the load by the drain current from the transistor Tr8 when the transistor Tr7 is turned off to deliver the output signal Vout of the H level.

However, when enough source current Iso is secured, the source current Iso retards the flow of the sink current Isi as the transistor Tr7 is turned on to draw the sink current Isi from the output terminal To, such that the falling rate of the output signal Vout is retarded while simultaneously increasing the current dissipation.

In the third circuit 30, a change in the potential at the node N1 is reflected in the gate potential of the transistor Tr9. When the sink current Isi into the transistor Tr7 increases due to a rise in the potential at the node N1, the gate potential of the transistor Tr7 rises, thus limiting the source current Iso. On the other hand, when the sink current Isi into the transistor Tr7 decreases due to a fall in the potential at the node N1, the gate potential of the transistor Tr9 falls to increase the source current Iso. Accordingly, the source current Iso of the transistor Tr9 is controlled in accordance with the load.

The potential difference between the gate of the transistor Tr7 and the gate of the transistor Tr9 corresponds to the gate-source voltage of the transistor Tr11. When the potential at the node N1 is around Vcc/2, the transistors Tr7 and Tr9 are both turned on. Accordingly, an increased current flow from the power supply Vcc through the transistors Tr9 and Tr7 simultaneously to the ground GND, presenting a problem of an increased current dissipation. Since the gate-source voltage of the transistor Tr11 varies due to variations from transistor to transistor during their manufacturing process or a change in the ambient temperatures of the transistors, it is not a simple matter to construct a circuit which accurately maintains the magnitude of the current flow.

SUMMARY OF THE INVENTION

It is an object of the present invention to provide a differential amplifier circuit which allows an output element to exercise its capability to its full extent while maintaining a low power dissipation.

To achieve the above objective, the present invention provides a differential amplifier comprising: a differential input circuit having first second input terminals for receiving first and second input signals, and amplifying a potential difference between the two input signals, and having first and second output terminals for outputting first and second voltage signals, respectively, the first and second voltage signals representing the amplified potential difference between the two input signals and a third output terminal for outputting third output signal of the differential amplifier; a first output transistor connected between a high potential power supply and the third output terminal for pulling-up a potential at the third terminal; a second output transistor connected between the third output terminal and a low potential power supply for pulling-down the potential at the third terminal; and a gate voltage controller connected to the first and second output terminals for receiving the first and second voltage signals, respectively, and for controlling voltages applied to each of the gate terminals of the first and second output transistors based on the first and second voltage signals to control the currents flowing to the first and second output transistors; wherein the gate voltage controller applies a voltage level substantially equal to the low potential power supply to the gate terminal of the first output transistor when turning on the first output transistor for pull-up operation, and wherein applies a voltage level substantially equal to the high potential power supply to the gate terminal of the second output transistor when turning on the second output transistor for pull-down operation.

The present invention further provides a differential amplifier circuit having first and second input terminals for receiving first and second input signals and an output terminal, comprising: a current mirror circuit including a first current mirror transistor and a second current mirror transistor, wherein a source of the first and second current mirror transistors is connected to a high potential power supply, a gate of the first current mirror transistor is connected to its drain and to a gate of the second current mirror transistor, and a drain of the first current mirror transistor is connected to a low potential power supply by way of a current source; a differential input circuit connected to the first and second input terminals for receiving the first and second input signals and amplifying a potential difference between the first and second input signals, and generating first and second voltage signals representing the potential difference, and a third output signal connected to the current mirror circuit; a first output transistor connected between the high potential power supply and the output terminal; a second output transistor connected between the output terminal and the low potential power supply; and a gate control voltage controller, connected to the differential input circuit and receiving the first and second voltage signals, for controlling voltages applied to the gates of the first and second output transistors based on the first and second voltage signals to control the currents flowing through the first and second output transistors, wherein the gate voltage controller applies a voltage level substantially equal to the low potential power supply to the gate terminal of the first output transistor when turning on the first output transistor and applies a voltage level substantially equal to the high potential power supply to the gate terminal of the second output transistor when turning on the second output transistor.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
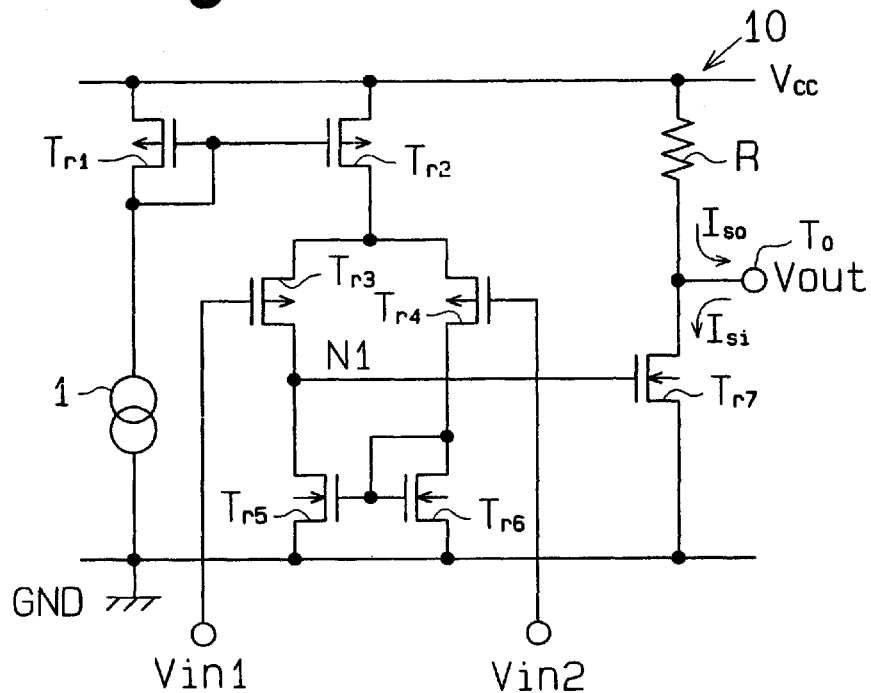
FIG. 1 is a circuit diagram illustrating a prior art comparator circuit.
Figure 2:
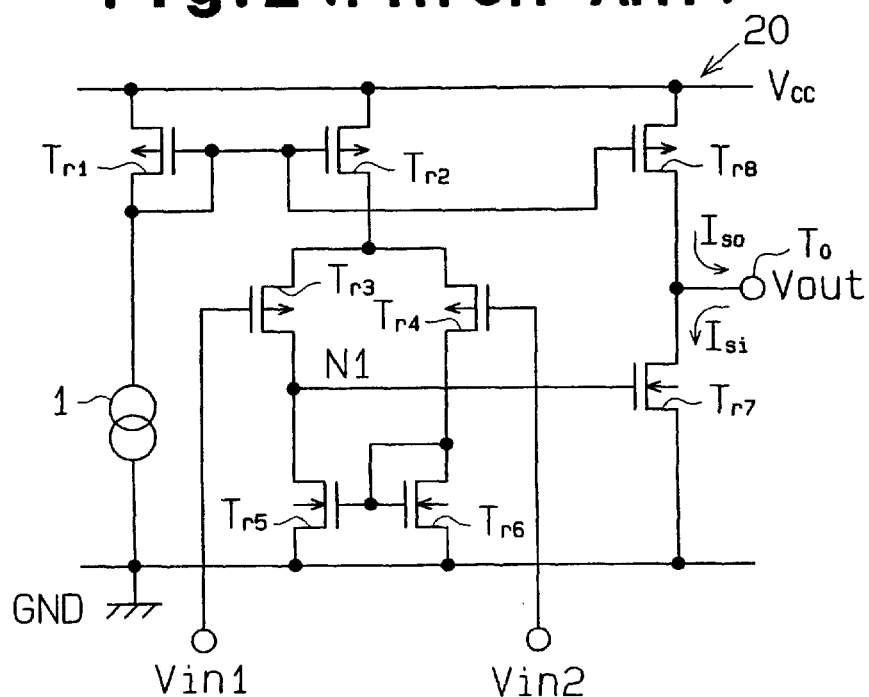
FIG. 2 is a circuit diagram illustrating a second prior art comparator circuit.
Figure 3:
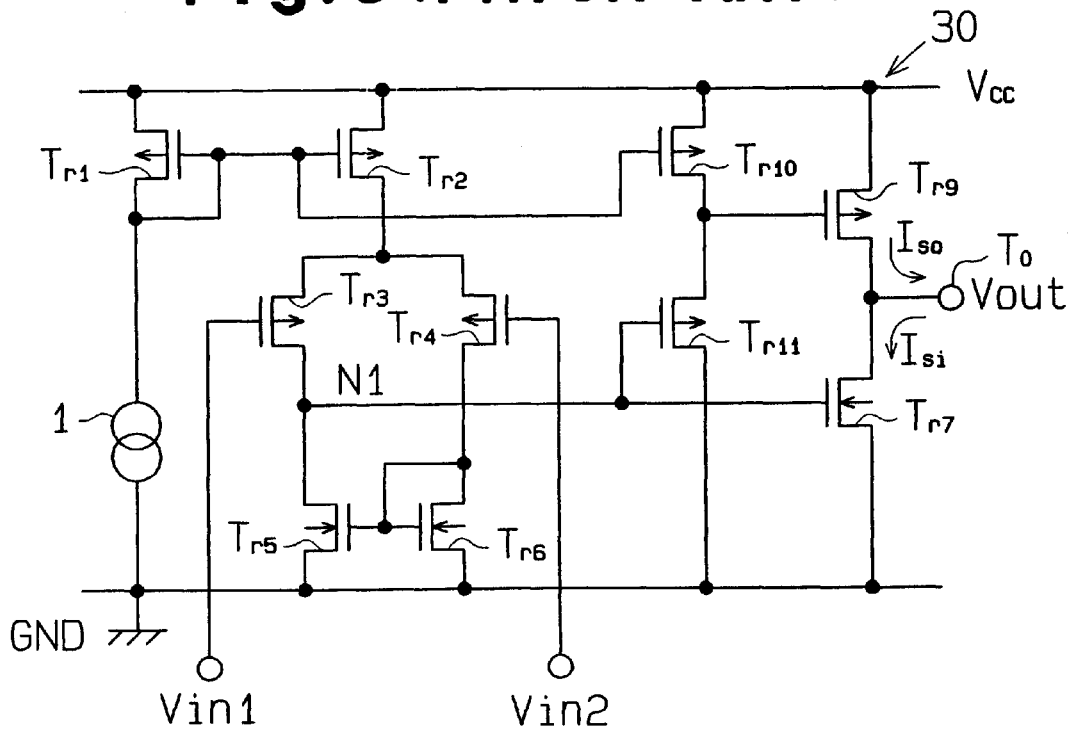
FIG. 3 is a circuit diagram illustrating a third prior art comparator circuit.
Figure 4:
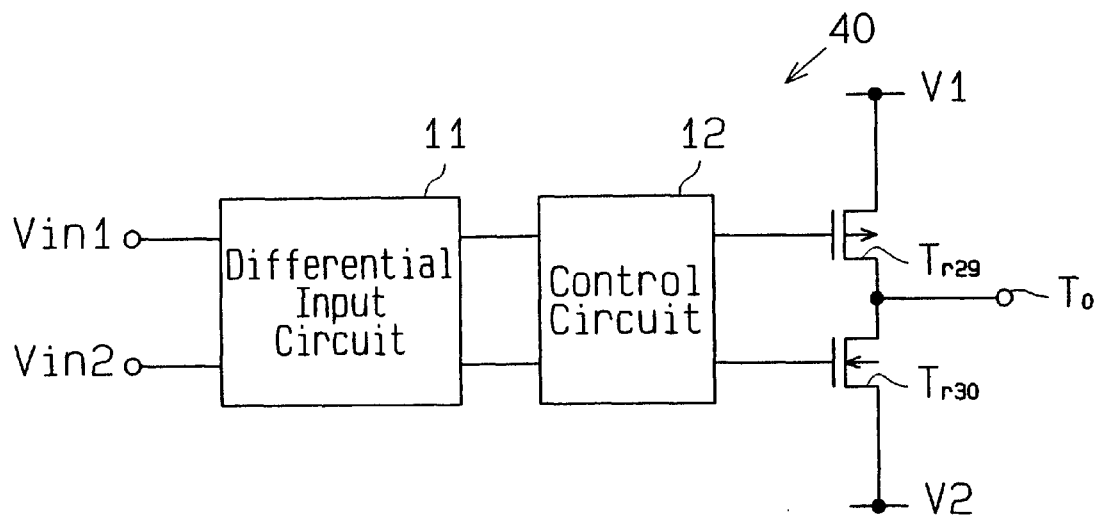
FIG. 4 is a block diagram illustrating the present invention.

Initially referring to FIG. 4, the concept of the present invention will be described.

A differential amplifier circuit 40 comprises a differential input circuit 11, a control circuit 12 and first and second output transistors Tr29 and Tr30. The differential input circuit 11 amplifies a potential difference between a pair of input signals Vin1, Vin2 and delivers an amplified signal to the control circuit 12 as first and second output signals. The first output transistor Tr29 is preferably a P-channel MOS transistor and is connected between a higher potential bus V1 and an output terminal To. The second output transistor Tr30 is preferably an N-channel MOS transistor and is connected between the output terminal To and a lower potential bus V2.

The control circuit 12 controls the gate voltages of the first and the second output transistors Tr29 and Tr30 in accordance with the first and the second output signals from the differential input circuit 11. The first output transistor Tr29 performs a pull-up operation to discharge the source current to the output terminal To. The second output transistor Tr30 performs a pull-down operation to draw a sink current from the output terminal To. The control circuit 12 establishes the gate potential of the transistor Tr29 at the level of the lower potential bus V2 in order to turn the first output transistor Tr29 on to provide the pull-up operation. Similarly, the control circuit 12 establishes the gate potential of the second output transistor Tr30 at the level of the higher potential bus V1 in order to turn the transistor Tr30 on to provide the pull-down operation.

In this manner, the current driving capability of the first output transistor Tr29 performs to its full extent during the pull-up operation while the current driving capability of the second output transistor Tr30 performs to its full extent during the pull-down operation.

First Embodiment

Figure 5:
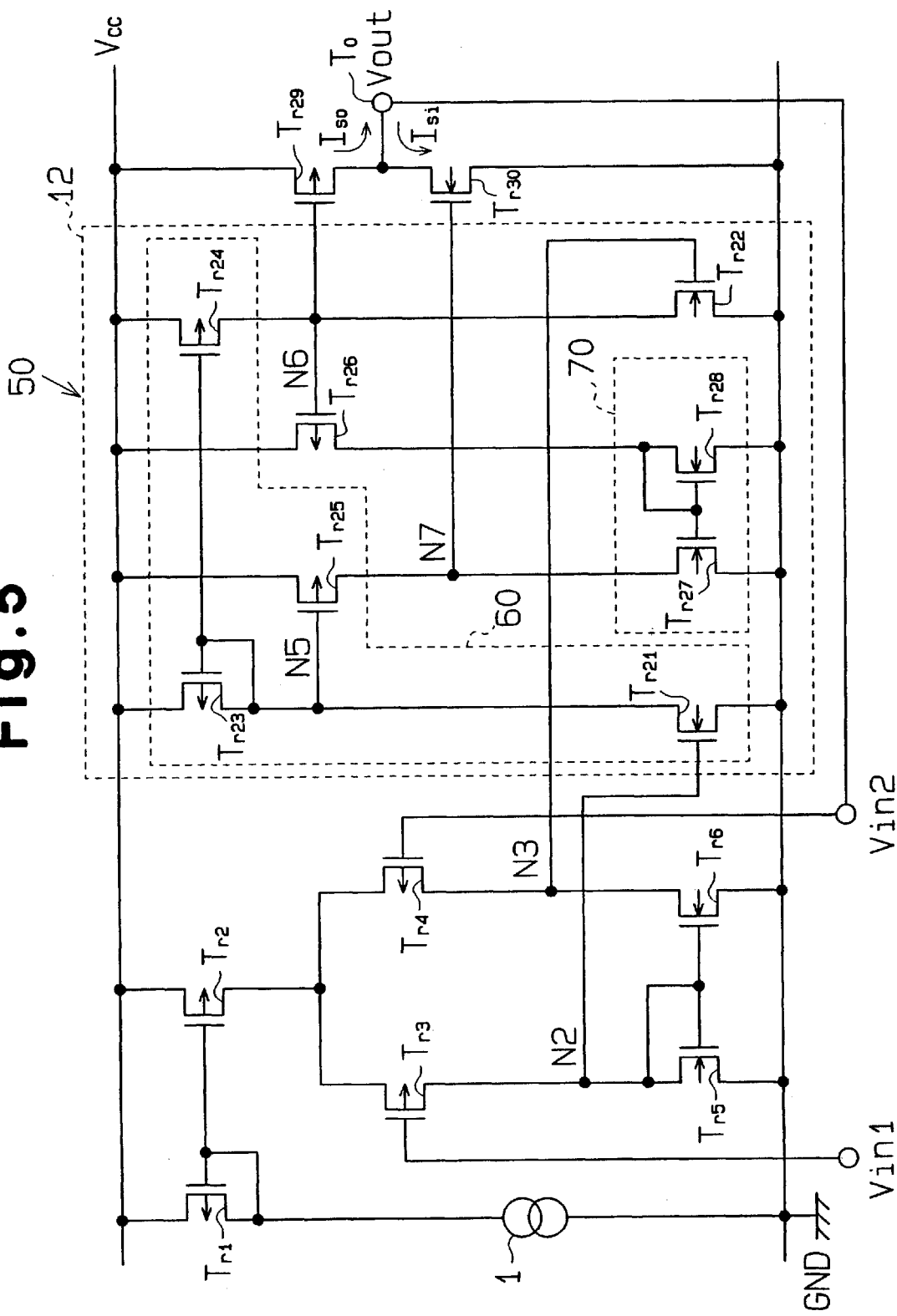
FIG. 5 is a circuit diagram illustrating an op amp circuit according to a first embodiment of the present invention.

Referring to FIG. 5, an op amp or differential amplifier circuit 50 according to a first embodiment of the present invention will be described. The current mirror circuit comprising the transistors Tr1 and Tr2 and the differential input circuit comprising the transistors Tr3 to Tr6 remain the same as in the prior art.

An N-channel MOS transistor Tr21 has a gate connected to a node N2 defined by the junction between the transistors Tr3 and Tr5, a source connected to the ground GND, and a drain connected to the power supply Vcc through a P-channel MOS transistor Tr23. The transistor Tr21 operates as a current mirror with respect to the transistor Tr5.

The transistor Tr23 has a gate connected to its drain and to the gate of a P-channel MOS transistor Tr24. The transistors Tr23 and Tr24 have sources connected to the power supply Vcc. The transistor Tr24 has a drain connected to the drain of an N-channel MOS transistor Tr22. The transistors Tr23 and Tr24 operate as a current mirror. The transistor Tr22 has a gate connected to a node N3 defined by the junction between the transistors Tr4 and Tr6, and a source connected to the ground GND.

A P-channel MOS transistor Tr25 has a gate connected to a node N5 defined by the junction between the transistors Tr23 and Tr21, and a source connected to the power supply Vcc. The transistor Tr25 operates as a current mirror with respect to the transistor Tr23. A P-channel MOS transistor Tr26 has a gate connected to a node N6 defined by the junction between the transistors Tr24 and Tr22, and a source connected to the power supply Vcc.

An N-channel MOS transistor Tr27 has a drain connected to the drain of the transistor Tr25. The junction between the transistors Tr25 and Tr27 defines a node N7. A transistor Tr28 has a drain connected to the drain of the transistor Tr26 and to its own gate. Both of the transistors Tr27 and Tr28 have gates connected each other and sources connected to the ground GND. The transistors Tr27 and Tr28 operate as a current mirror to each other.

A P-channel MOS transistor Tr29 is an output transistor having a gate connected to the node N6 and a source connected to the power supply Vcc. The transistors Tr26 and Tr29 operate as a current mirror to each other. An N-channel MOS transistor Tr30 is an output transistor having a gate connected to the node N7 and a source connected to the ground. Both of the transistors Tr29 and Tr30 have their drains connected to the output terminal To. An output signal Vout delivered from the output terminal To is fed back to the gate of the transistor Tr4 as the input signal Vin2.

The transistors Tr21 to Tr28 form the control circuit 12 which controls the gate potentials of the transistors Tr29 and Tr30. The transistors Tr21, and Tr23 to Tr25 form a first current control circuit 60, and the transistors Tr27 and Tr28 form a second current control circuit 70.

The operation of the op amp circuit 50 will be described below.

(1) When a capacitive load is connected between the output terminal To and the ground GND and when the voltage level of the input signal Vin1 rises:

As the input voltage Vin1 rises, the drain current from the transistor Tr3 decreases while the drain current from the transistor Tr4 increases in a relative manner. Such current changes cause the potential at the node N2 to fall and the potential at the node N3 to rise. Consequently, the transistor Tr21 is turned off while the transistor Tr22 is turned on.

As the transistor Tr21 is turned off, the transistors Tr23 and Tr24 are also turned off. Because the transistor Tr24 is off while the transistor Tr22 is on, the potential at the node N6 is established at the drain-source voltage of the transistor Tr22, which is substantially equal to the ground GND level.

As the transistor Tr21 is turned off, the transistor Tr25 is also turned off. Since the potential at the node N6 is substantially equal to the ground GND level, the transistor Tr26 is turned on as are the transistors Tr27 and Tr28. Since the transistor Tr25 is off while the transistor Tr27 is on, the potential at the node N7 is established by an amount corresponding to the drain-source voltage of the transistor Tr7 higher than the ground GND level or substantially equal to the ground GND level. Accordingly, during the time the transistor Tr29 is on, the transistor Tr30 is turned off in a positive manner, thus avoiding the simultaneous current flow through the transistors Tr29 and Tr30 and thus reducing the current dissipation.

Since the transistor Tr29 is turned on while the transistor Tr30 is turned off, the source current Iso is delivered to the capacitive load connected to the output terminal To. This allows the output signal Vout to rise until it substantially coincides with the voltage level of the input signal Vin1. As the source current is discharged to the load which is connected to the output terminal To, the gate potential of the transistor Tr29 is pulled down close to the ground GND level irrespective of the voltage levels of the input signals Vin1, Vin2. Consequently, the transistor Tr29 is allowed to exercise its current driving capability to its full extent.

(2) When a capacitive load is connected between the output terminal To and the ground GND and when the input signal Vin1 falls:

When the input signal Vin1 falls, the drain current from the transistor Tr3 increases while the drain current from the transistor Tr4 decreases in a relative manner. Such current changes causes the potential at the node N2 to rise and cause the potential at the node N3 to fall, with consequence that the transistor Tr21 is turned on while the transistor Tr22 is turned off.

As the transistor Tr21 is turned on, the transistors Tr23 and Tr24 are also turned on. Since the transistor Tr24 is on while the transistor Tr22 is off, the potential at the node N6 is established by an amount corresponding to the drain-source voltage of the transistor Tr24, which is lower than the supply voltage Vcc or substantially equal to the level of the supply voltage Vcc.

As the transistor Tr21 is turned on, the transistor Tr25 is also turned on. Since the potential at the node N6 is substantially equal to the level of the supply voltage Vcc, the transistor Tr26 is turned off, as are the transistors Tr27 and Tr28. Since the transistor Tr25 is on while the transistor Tr27 is off, the potential at the node N7 is established by an amount corresponding to the drain-source voltage of the transistor Tr25, which is lower than the supply voltage Vcc or substantially equal to the level of the supply voltage Vcc.

In this manner, during the time the transistor Tr29 is turned off, the transistor Tr30 is turned on in a positive manner, thus avoiding the simultaneous current flow through the transistors Tr29 and Tr30 and thus reducing the current dissipation.

As the transistor Tr29 is turned off, the transistor Tr30 is turned on. Consequently, the sink current Isi is drawn from the capacitive load connected to the output terminal To. This allows the output signal Vout to be reduced until it substantially coincides with the voltage level of the input signal Vin1. At this time, the gate potential of the transistor Tr30 is pulled up close to the level of the supply voltage Vcc, irrespective of the voltage levels of the input signals Vin1, Vin2. As a consequence, the transistor Tr30 is allowed to exercise its current driving capability to its full extent. Therefore, gate potentials for the transistors Tr29 and Tr30 are obtained which allow them to perform irrespective of the voltage levels of the input signals Vin1, Vin2. As a result, if transistors of a reduced size as compared with a conventional arrangement are used, a comparable load driving capability is secured.

(3) When the levels of the input signals Vin1, Vin2 substantially coincide with each other:

When the levels of the input signals Vin1, Vin2 substantially coincide with each other, or when the output signal Vout substantially coincides with the input signal Vin1, the respective transistors Tr3 and Tr4 have an equal drain current, and the nodes N2 and N3 have an equal potential. Accordingly, the respective transistors Tr21 and Tr22 have an equal drain current, which is also equal to the drain current from each of the transistors Tr23, Tr24 and Tr25. In addition, the transistors Tr24 and Tr22 have an equal drain current, and a potential at the node N6 assumes a substantially median level between the supply voltage Vcc and the ground GND or Vcc/2.

In addition, the transistors Tr25 and Tr27 have equal drain currents, and the transistors Tr25 and Tr26 have equal drain currents. Accordingly, the potential at the node N7 assumes a median level approximately between the supply voltage Vcc and the ground GND. Since the transistors Tr26 and Tr29 operate as a current mirror, the transistors Tr26 and Tr29 have equal drain currents. As a result, the transistors Tr21, Tr29 and Tr30 all have equal drain currents, and the idling current of the transistor Tr29 is equal to the drain current from the transistor Tr21.

Since the drain current from the transistor Tr21 is equal to the drain current from the transistor Tr5 and since the transistors Tr5 and Tr6 have a drain current which is equal to each other, the drain current from the transistor Tr5 is one-half the drain current from the transistor Tr2 or one-half the bias current fed from the input differential pair. In this manner, the idling current of the transistor Tr9 is established by the bias current from the input differential circuit. As a consequence, by suitably choosing the bias current, both the load driving capability and the power dissipation can be chosen appropriately.

(4) When a sink current load or a source current load is connected to the output terminal To:

When a sink current load, namely, a load which supplies a sink current Isi to the output terminal Vout, is connected to the output terminal To, the transistor Tr30 draws the sink current Isi from the load so that the input signals Vin1, Vin2 become substantially equal to each other, in a similar manner to when the voltage level of the input signal Vin1 is lowered.

The gate potential of the transistor Tr30 is lower than the supply voltage Vcc by an amount corresponding to the source-drain voltage of the transistor Tr25, thus rising close to the level of the supply voltage Vcc at maximum. When the drain current from the transistor Tr24 passes through the transistor Tr22, a fall in the potential at the node N3 causes the drain-source voltage of the transistor Tr22 to increase, thus raising the potential at the node N6. As a consequence, the drain current from the transistor Tr26 decreases, causing the drain potential of the transistor Tr28 and the gate potentials of the transistors Tr28 and Tr27 to fall.

Since a constant drain current is fed from the transistor Tr25 to the transistor Tr27, the drain-source voltage of the transistor Tr27 increases in response to a reduction in its gate potential. The gate potential of the transistor Tr30 is at its maximum when the source-drain voltage of the transistor Tr25 has been decreased to its operating limit. The drain current from the transistor Tr30 which is based on such gate potential represents the maximum sink current which is drawn from the load by the transistor Tr30.

On the other hand, when a source current load, namely, a load which draws a source current Iso, is connected to the output terminal To, the transistor Tr29 discharges the source current Iso to the load so that the input signals Vin1, Vin2 become substantially equal to each other, in the similar manner as when the voltage level of the input signal Vin1 is raised.

The gate potential of the transistor Tr29 is above the ground GND by an amount corresponding to the source-drain voltage of the transistor Tr22, and falls close to the ground GND level at its minimum. As the drain current from the transistor Tr29 increases, the drain current from the transistor Tr26 increases, which in turn causes the drain voltage and the gate voltage of the transistor Tr28 to rise.

The transistor Tr27, which operates as a current mirror with respect to the transistor Tr28, has its drain-source voltage reduced to the limit of operating as an MOS transistor, which is determined by the constant drain current fed from the transistor Tr25. Accordingly, when the drain-source voltage of the transistor Tr27 is reduced to its operating limit, the drain currents from the transistors Tr28 and Tr26, or the source current which is discharged from the transistor Tr29 to the load is at its maximum.

Second Embodiment

Figure 6:
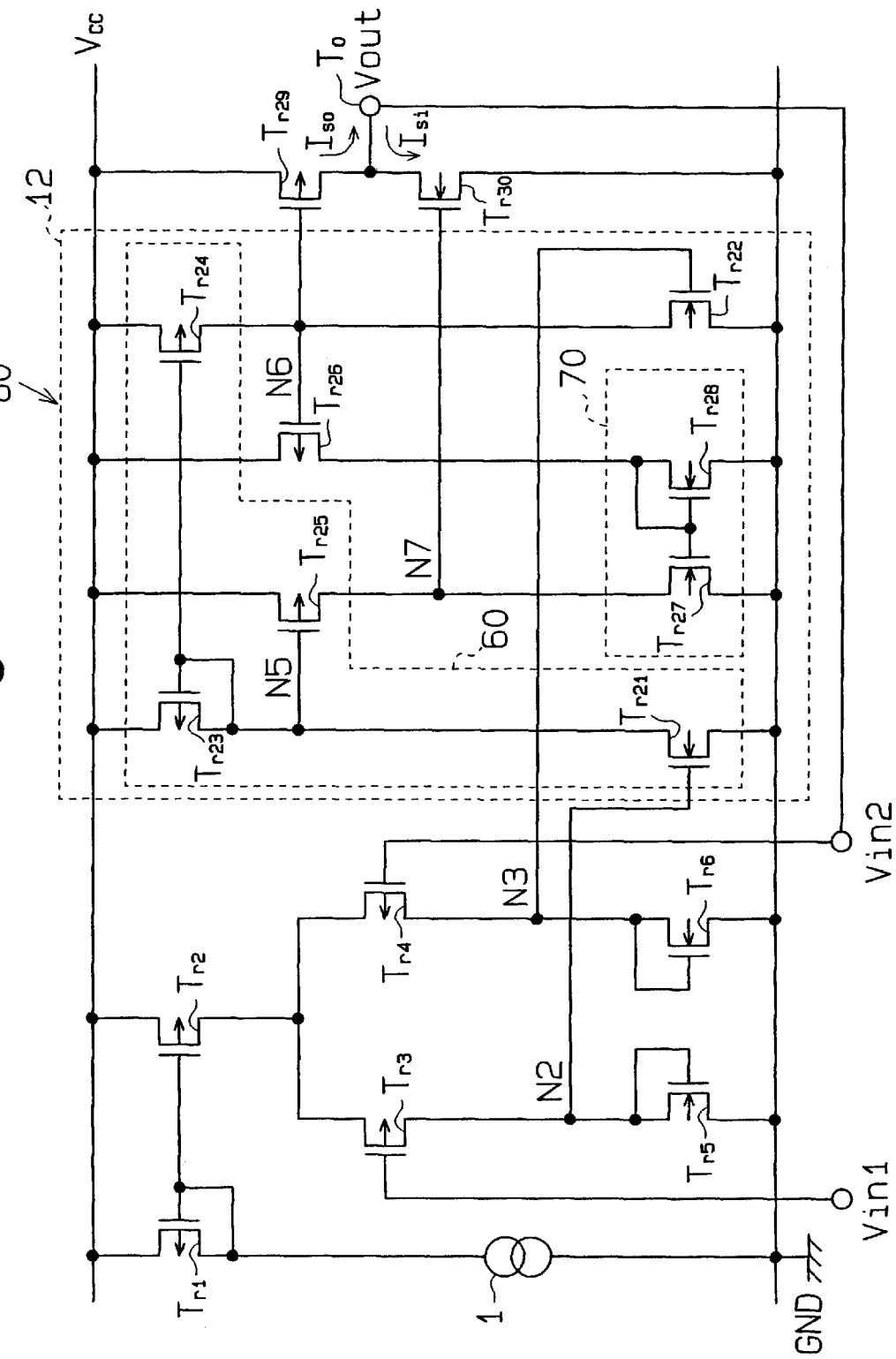
FIG. 6 is a circuit diagram illustrating an op amp circuit according to a second embodiment of the present invention.

Referring to FIG. 6, an op amp or differential amplifier circuit 80 according to a second embodiment of the present invention will be described. The op amp circuit 80 differs from the op amp circuit 50 of the first embodiment in that the drain of each of the transistors Tr5 and Tr6 is connected to its own gate to provide a diode connection.

In this instance, the transistors Tr5 and Tr6 do not operate as a current mirror. The sizes of the transistors Tr5 and Tr6 are chosen so that a required potential difference is produced between the nodes N2, N3 in accordance with a change in the drain currents from the transistors Tr3 and Tr4 on the basis of the input signals Vin1, Vin2.

Third Embodiment

Figure 7:
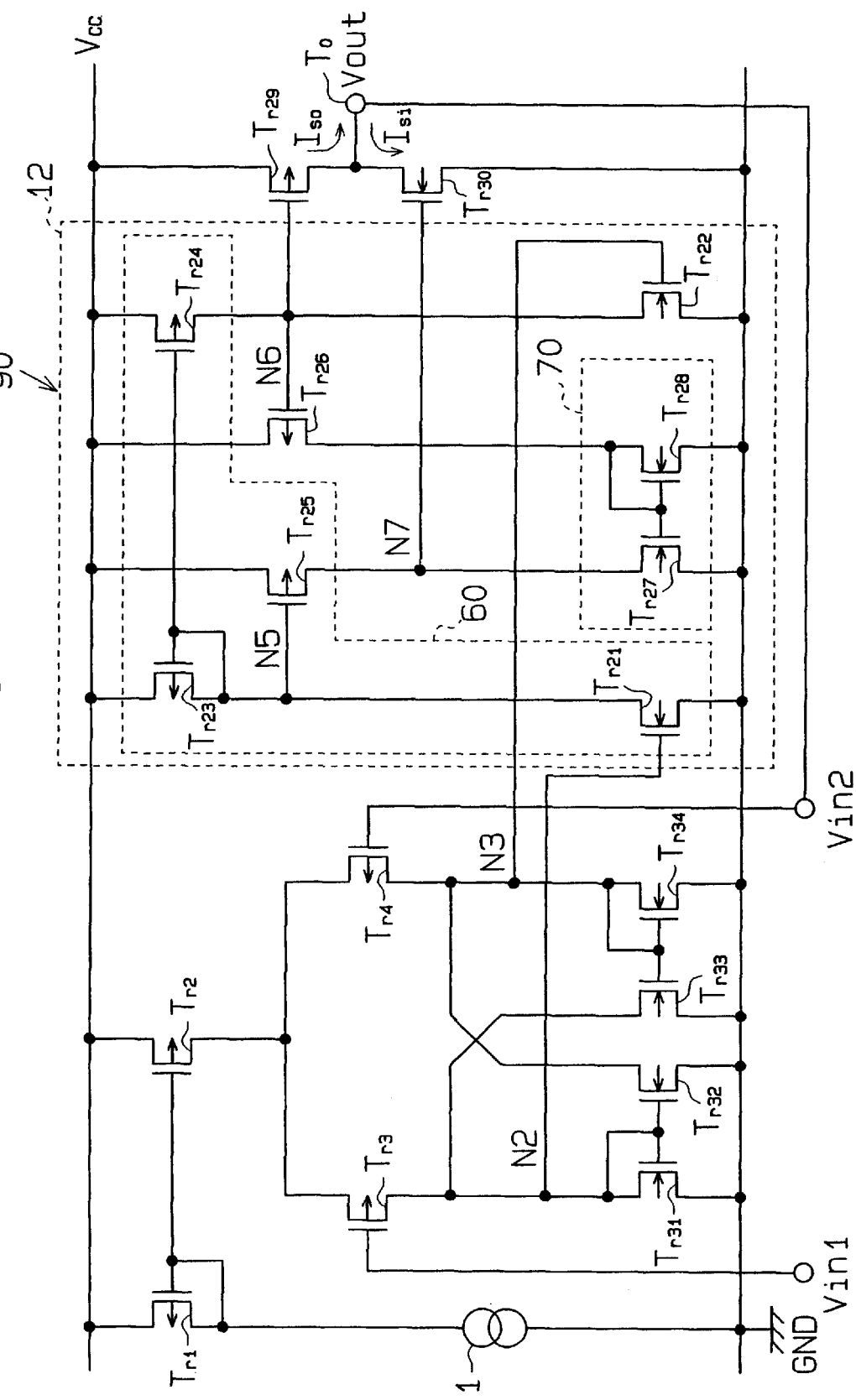
FIG. 7 is a circuit diagram illustrating an op amp circuit according to a third embodiment of the present invention.

Referring to FIG. 7, an op amp or differential amplifier circuit 90 according to a third embodiment of the present invention will be described. The transistors Tr5 and Tr6 in the first embodiment are replaced by N-channel MOS transistors Tr31 to Tr34 in the third embodiment.

Specifically, a transistor Tr31 has a drain connected to the drain of the transistor Tr3 and to its own gate. A transistor Tr32 has a drain connected to the drain of the transistor Tr4. The transistors Tr31 and Tr32 have their gates connected together and to the drain of the transistor Tr31.

A transistor Tr33 has a drain connected to the drain of the transistor Tr3. A transistor Tr34 has a drain connected to the drain of the transistor Tr4 and to its own gate. The transistors Tr33 and Tr34 have their gates connected together. The transistors Tr31 to Tr34 have sources connected to the ground GND. The transistor pair Tr31 and Tr32 operates as a current mirror, as does the transistor pair Tr33 and Tr34.

The potential at the node N3 is determined on the basis of the potential at the node N2 produced by the drain current from the transistor Tr3, while the potential at the node N2 is determined on the basis of the potential at the node N3 produced by the drain current from the transistor Tr4. In this manner, the accuracy of the potentials produced at the nodes N2, N3 on the basis of the input signals Vin1, Vin2 is improved as compared with that achieved by the first embodiment.

Fourth Embodiment

Figure 8:
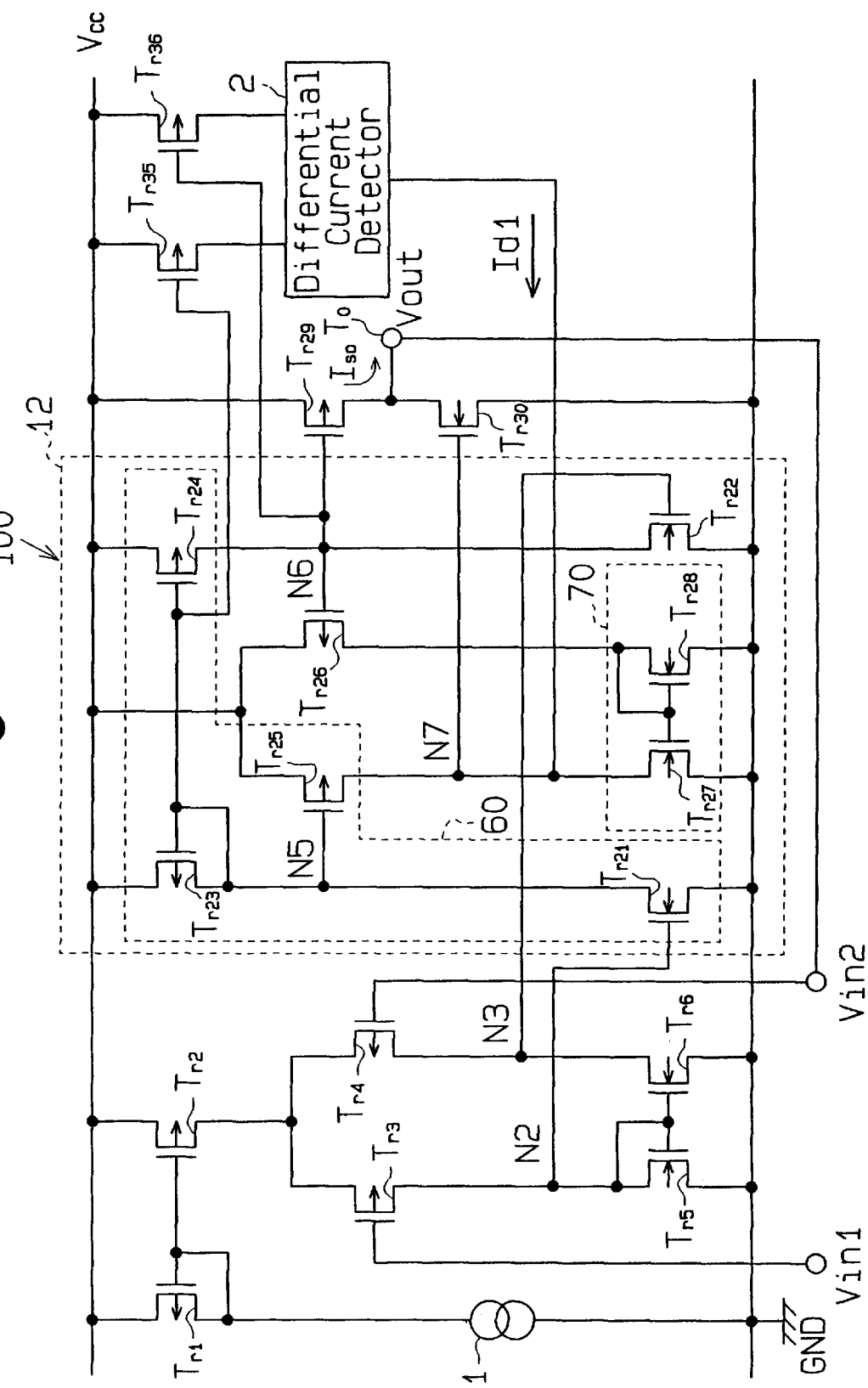
FIG. 8 is a circuit diagram illustrating an op amp circuit according to a fourth embodiment of the present invention.

Referring to FIG. 8, an op amp or differential amplifier circuit 100 according to a fourth embodiment of the present invention will be described. In the fourth embodiment, in order to achieve a further increase in the maximum output transistor source current, P-channel MOS transistors Tr35 and Tr36 and a differential current detection circuit 2 or a current correction circuit are added to the arrangement of the first embodiment (op amp circuit 50).

The transistor Tr35 has a source connected to the power supply Vcc, a drain connected to the differential current detection circuit 2 and a gate connected to the gates of the transistors Tr23 to Tr25. The transistor Tr35 operates as a current mirror with respect to the transistors Tr23 to Tr25.

The transistor Tr36 has a source connected to the power supply Vcc, a drain connected to the differential current detection circuit 2 and a gate connected to the gates of the transistors Tr26 and Tr29. The transistor Tr36 operates as a current mirror with respect to the transistors Tr26 and Tr29.

When the drain current from the transistor Tr26 increases as the source current which flows from the transistor Tr29 to the load increases, the differential current detection circuit 2 detects a difference between the drain currents from the transistors Tr35 and Tr36, which corresponds to a difference between the drain currents from the transistors Tr25 and Tr26, and feeds the differential current Id1 to the drain of the transistor Tr27.

If a difference between the drain currents from the transistors Tr25 and Tr26 occurs as a result of an increase in the source current which flows from the transistor Tr29 to the load, the supply of the differential current Id1 to the drain of the transistor Tr27 allows a stable current mirror operation of the transistors Tr27 and Tr28. In this manner, a sufficient drain current is supplied to the transistor Tr27 to allow the potential at the node N7 to fall in a satisfactory manner. This potential fall substantially cuts off the drain current from the transistor Tr30. As a consequence, the drain current from the transistor Tr29 is supplied to the load as the source current without passing through the transistor Tr30. In this manner, the maximum source current is increased as compared with the first embodiment.

Fifth Embodiment

Figure 9:
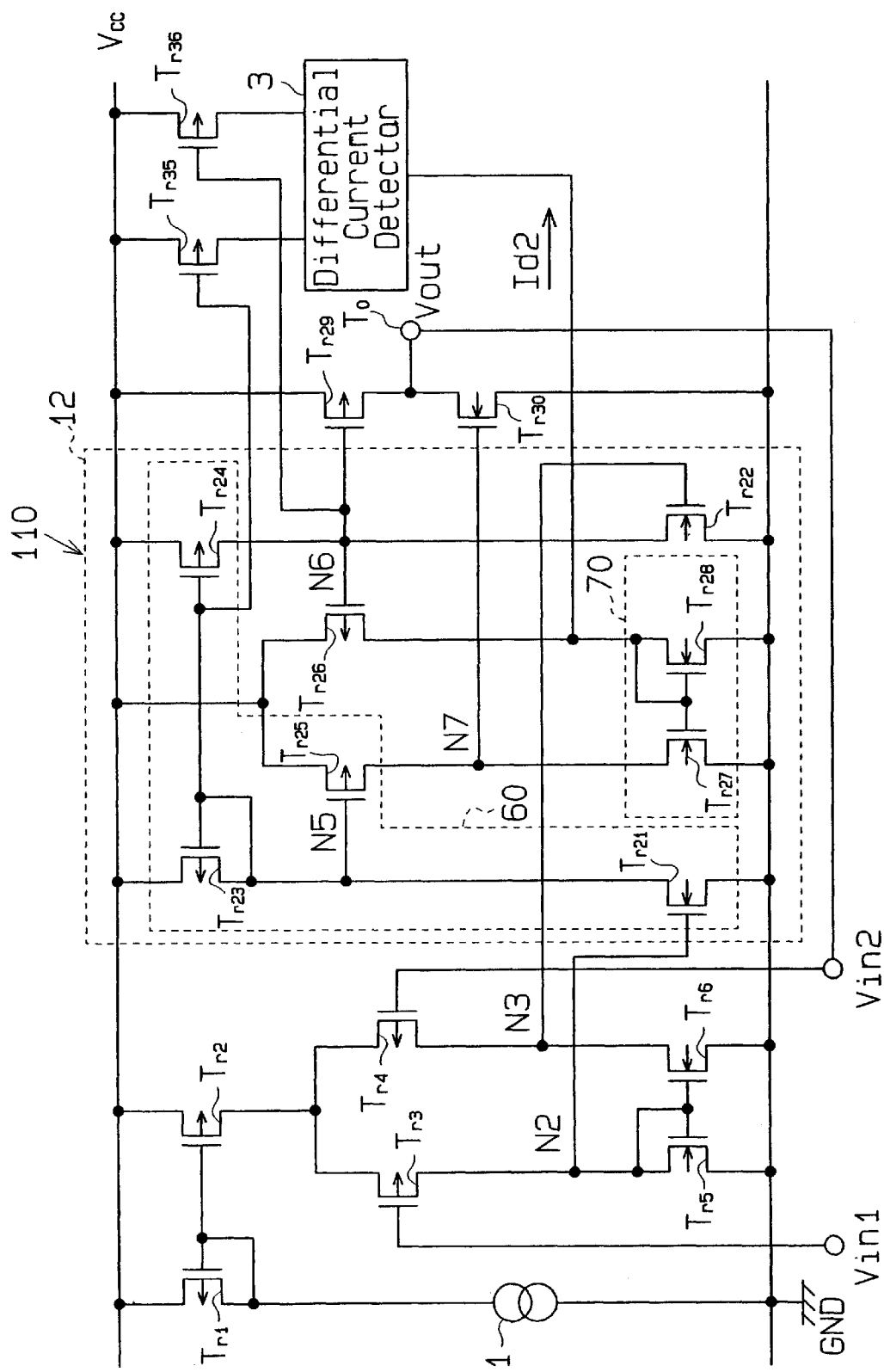
FIG. 9 is a circuit diagram illustrating an op amp circuit according to a fifth embodiment of the present invention.

As shown in FIG. 9, an op amp or differential amplifier circuit 110 according to a fifth embodiment of the present invention differs from the fourth embodiment (op amp circuit 100) in respect of a differential current detection circuit 3. The differential current detection circuit 3 has an output terminal connected to the drain of the transistor Tr28. The differential current detection circuit 3 draws a differential current Id2, which is equal to a difference between the drain currents from the transistors Tr35 and Tr36, from the drain of the transistor Tr28.

When a difference in the drain currents from the transistors Tr25 and Tr26 occurs as a result of an increase in the source current which flows from the transistor Tr29 to the load, the differential current detection circuit 3 draws or absorbs the differential current Id2. The op amp circuit 110 of the fifth embodiment thus achieves substantially similar function and effect as achieved by the fourth embodiment.

Therefore, the present examples and embodiments are to be considered as illustrative and not restrictive and the invention is not to be limited to the details given herein, but may be modified within the scope and equivalence of the appended claims.

What is claimed is:

1. A differential amplifier comprising:

a differential input circuit having first and second input terminals for receiving first and second input signals, and amplifying a potential difference between the two input signals, and having first and second output terminals for outputting first and second voltage signals, respectively, the first and second voltage signals representing the amplified potential difference between the two input signals;

a third output terminal for outputting a third output signal of the differential amplifier;

a first output transistor connected between a high potential power supply and the third output terminal for pulling-up a potential at the third output terminal wherein the first output transistor includes a P-channel MOS transistor;

a second output transistor connected between the third output terminal and a low potential power supply for pulling-down the potential at the third output terminal wherein the second output transistor includes an N-channel MOS transistor; and a gate voltage controller connected to the first and second output terminals for receiving the first and second voltage signals, respectively, and for controlling voltages applied to each of the gate terminals of the first and second output transistors based on the first and second voltage signals to control the currents flowing to the first and second output transistors;

wherein the gate voltage controller applies a voltage level substantially equal to the low potential power supply to the gate terminal of the first output transistor when turning on the first output transistor for pull-up operation, and wherein applies a voltage level substantially equal to the high potential power supply to the gate terminal of the second output transistor when turning on the second output transistor for pull-down operation;

wherein the gate voltage controller applies a voltage that is higher than that of the low potential power supply by a predetermined voltage to the gate terminal of the first output transistor for pull-up operation, and applies a voltage that is lower than that of the high potential power supply by the predetermined voltage to the gate terminal of the second output transistor for pull-down operation;

wherein the predetermined voltage is a source-drain voltage of a MOS transistor at an on-state.

2. A differential amplifier comprising:

a differential input circuit having first and second input terminals for receiving first and second input signals, and amplifying a potential difference between the two input signals, and having first and second output terminals for outputting first and second voltage signals, respectively, the first and second voltage signals representing the amplified potential difference between the two input signals;

a third output terminal for outputting a third output signal of the differential amplifier;

a first output transistor connected between a high potential power supply and the third output terminal for pulling-up a potential at the third output terminal wherein the first output transistor includes a P-channel MOS transistor;

a second output transistor connected between the third output terminal and a low potential power supply for pulling-down the potential at the third output terminal wherein the second output transistor includes an N-channel MOS transistor; and a gate voltage controller connected to the first and second output terminals for receiving the first and second voltage signals, respectively, and for controlling voltages applied to each of the gate terminals of the first and second output transistors based on the first and second voltage signals to control the currents flowing to the first and second output transistors;

wherein the gate voltage controller applies a voltage level substantially equal to the low potential power supply to the gate terminal of the first output transistor when turning on the first output transistor for pull-up operation, and wherein applies a voltage level substantially equal to the high potential power supply to the gate terminal of the second output transistor when turning on the second output transistor for pull-down operation, wherein the gate voltage controller applies a voltage that is higher than that of the low potential power supply by a predetermined voltage to the gate terminal of the second output transistor for pull-up operation, and applies a voltage that is lower than that of the high potential power supply by the predetermined voltage to the gate terminal of the first output transistor for pull-down operation;

wherein the predetermined voltage is a source-drain voltage of a MOS transistor at an on-state.

3. The differential amplifier according to claim 1 or 2, wherein the gate voltage controller includes:

a first current controller for receiving the first voltage signal from the first output terminal and outputting a current corresponding to the first voltage signal; and a first MOS transistor for receiving the second voltage signal from the second output terminal and for outputting a drain current corresponding to the second voltage signal;

wherein the gate terminal of the first output transistor is connected to the first current controller and the first MOS transistor, and a voltage corresponding to a current ratio of an output current of the first current controller to the drain current of the first MOS transistor is applied to the gate terminal of the first output transistor.

4. The differential amplifier according to claim 3, wherein the gate voltage controller includes:

a second MOS transistor having a drain current that is substantially equal to the drain current of the first output transistor; and a second current controller for receiving the drain current from the second MOS transistor and outputting a current corresponding to the drain current from the second MOS transistor;

wherein the gate terminal of the second output transistor is connected to the second current controller and the second MOS transistor, and a voltage corresponding to a current ratio of an output current of the second current controller to the drain current of the second MOS transistor is applied to the gate terminal of the second output transistor.

5. The differential amplifier according to claim 4, wherein the first current controller includes a current mirror circuit for setting an idling current flowing to the first output transistor based on a bias current of the differential input circuit.

6. The differential amplifier according to claim 4, further comprising a current correction circuit for correcting a current difference between an input current provided to the second current controller and an output current from the first current controller and supplying the second current controller with a current corresponding to the current difference.

7. The differential amplifier according to claim 6, wherein the second current controller includes a current mirror circuit, and wherein the current correction circuit supplies the current mirror circuit of the second current controller with the current corresponding to the current difference.

8. The differential amplifier according to claim 6, wherein the second current controller includes a current mirror circuit, and wherein the current correction circuit absorbs the current corresponding to the current difference from the current mirror circuit of the second current controller.

9. The differential amplifier according to claim 1 or 2, further comprising:
a first MOS transistor connected to the first output terminal; and
a second MOS transistor connected to the second output terminal, wherein the first and second MOS transistors generate an operating current for the differential input circuit.

10. The differential amplifier according to claim 1 or 2, further comprising:
a first current mirror circuit connected to the first and second output terminals and formed as part of the differential input circuit; and
a second current mirror circuit connected to the first and second output terminals and formed as part of the gate voltage controller;
wherein the first and second current mirror circuits form a pair, and generate an operating current for the differential input circuit.

11. The differential amplifier according to claim 10, wherein each of the first and second current mirror circuits includes a pair of transistors.

12. The differential amplifier according to claim 1 or 2, wherein the third output terminal is connected to one of the first and second input terminals.

13. A differential amplifier circuit having first and second input terminals for receiving first and second input signals and an output terminal, comprising:
a current mirror circuit including a first current mirror transistor and a second current mirror transistor, wherein a source of the first and second current mirror transistors is connected to a high potential power supply, a gate of the first current mirror transistor is connected to its drain and to a gate of the second current mirror transistor, and a drain of the first current mirror transistor is connected to a low potential power supply by way of a current source;
a differential input circuit connected to the first and second input terminals for receiving the first and second input signals and amplifying a potential difference between the first and second input signals, and generating first and second voltage signals representing the potential difference, and the differential input circuit connected to the current mirror circuit;
a first output transistor connected between the high potential power supply and the output terminal;
a second output transistor connected between the output terminal and the low potential power supply; and
a gate control voltage controller, connected to the differential input circuit and receiving the first and second voltage signals, for controlling voltages applied to the gates of the first and second output transistors based on the first and second voltage signals to control the currents flowing through the first and second output transistors, wherein the gate voltage controller applies a voltage level substantially equal to the low potential power supply to the gate terminal of the first output transistor when turning on the first output transistor and applies a voltage level substantially equal to the high potential power supply to the gate terminal of the second output transistor when turning on the second output transistor.

14. The differential amplifier circuit of claim 13, wherein the output terminal is connected to the second input terminal.

15. The differential amplifier circuit of claim 13, wherein the differential input circuit is connected to the drain of the second transistor of the current mirror circuit.

16. The differential amplifier circuit of claim 13, wherein the differential input circuit comprises:
a first transistor having its gate connected to the first input terminal for receiving the first input signal;
a second transistor having its gate connected to the second input terminal for receiving the second input signal, and its source connected to the source of the first transistor;
a third transistor connected between the first transistor and the low potential power supply, a gate of the third transistor being connected to its drain and to the drain of the first transistor; and
a fourth transistor connected between the second transistor and the low potential power supply, a gate of the fourth transistor being connected to the gate of the third transistor and to the drain of the second transistor, wherein the first voltage signal is provided from a first node between the drains of the first and third transistors, the second voltage signal is provided from a second node between the drains of the second and fourth transistors, and a third output signal is provided to the current mirror circuit from a node between the source of the first and second transistors.

17. The differential amplifier circuit of claim 13, wherein the differential input circuit comprises:
a first transistor having its gate connected to the first input terminal for receiving the first input signal;
a second transistor having its gate connected to the second input terminal for receiving the second input signal, and its source connected to the source of the first transistor;
a third transistor connected between the first transistor and the low potential power supply, a gate of the third transistor being connected to its drain and to the drain of the first transistor; and
a fourth transistor connected between the second transistor and the low potential power supply, a gate of the fourth transistor being connected to its drain and to the drain of the second transistor, wherein the first voltage signal is provided from a first node between the drains of the first and third transistors, the second voltage signal is provided from a second node between the drains of the second and fourth transistors, and a third output signal is provided to the current mirror circuit from a node between the source of the first and second transistors.

18. The differential amplifier circuit of claim 13, wherein the gate voltage controller comprises:

a first current control circuit receiving the first voltage signal;

a second current control circuit connected to the first current control circuit;

a first transistor connected between the first current control circuit and the second current control circuit; and a second transistor connected between the first current control circuit and the low potential power supply, a first node being defined at a connection of the drain of the second transistor, the first current control circuit and the gate of the first transistor, and a second node being defined at a connection between the first and second current control circuits, wherein a first gate control signal is provided for controlling the gate of the first output transistor and a second gate control signal is provided for controlling the gate of the second output transistor, the first gate control signal being provided from the first node and the second gate control signal being provided from the second node.

19. The differential amplifier circuit of claim 18, wherein the second current control circuit comprises:

a first transistor connected between the first current control circuit and the low potential power supply; and a second transistor connected between the first transistor of the gate voltage controller and the low potential power supply, wherein the gates of the first and second transistors of the second current control circuit are connected together and to the drain of the second transistor.

20. The differential amplifier circuit of claim 19, wherein the first current control circuit comprises:

a first transistor having a gate connected to the differential input circuit and receiving the first voltage signal and a source connected to the low potential power supply;

a second transistor having a source connected to the high potential power supply, a drain connected to the drain of the first transistor of the first current control circuit, and a gate connected to its drain and to the drain of the first transistor;

a third transistor having a source connected to the high potential power supply, a gate connected to the gate of the second transistor, and a drain connected to the drain of the second transistor of the gate voltage controller; and a fourth transistor having a source connected to the high potential power supply, a gate connected to the drains of the first and second transistors of the first current control circuit, and a drain connected to the gate of the second output transistor.

21. The differential amplifier circuit of claim 13, wherein the differential input circuit comprises:

a first transistor having its gate connected to the first input terminal for receiving the first input signal;

a second transistor having its gate connected to the second input terminal for receiving the second input signal, and its source connected to the source of the first transistor;

a third transistor connected between the first transistor and the low potential power supply, a gate of the third transistor being connected to its drain and to the drain of the first transistor;

a fourth transistor connected between the second transistor and the low potential power supply, a gate of the fourth transistor being connected to its drain and to the drain of the second transistor;

a fifth transistor connected between the second transistor and the low potential power supply, a gate of the fifth transistor being connected to the gate of the third transistor; and a sixth transistor connected between the first transistor and the low potential power supply, a gate of the sixth transistor being connected to the gate of the fourth transistor, wherein the first voltage signal is provided from a first node at a connection of the drains of the first, third and sixth transistors, the second voltage signal is provided from a second node at a connection of the drains of the second, fourth and fifth transistors, and a third output signal is provided to the current mirror circuit from a third node at a connection of the sources of the first and second transistors.

22. The differential amplifier circuit of claim 13, further comprising:

a differential current detector circuit;

a first transistor, connected between the high potential power supply and the differential current detector circuit, having a gate connected to the gate voltage controller; and a second transistor, connected between the high potential power supply and the differential current detector circuit, having a gate connected to the gate of the first output transistor, wherein the differential current detection circuit detects a difference between the drain currents from the first and second transistors and feeds a differential current to the differential input circuit, thereby allowing for a maximum source current at the output terminal of the differential amplifier circuit.

* * * * *